(12) United States Patent
Kim et al.

(10) Patent No.: US 9,099,541 B2
(45) Date of Patent: Aug. 4, 2015

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Ji Hwang Kim, Bucheon-si (KR); Sunpil Youn, Seoul (KR); Sangwon Kim, Seoul (KR); Kwang-chul Choi, Suwon-si (KR); Tae Hong Min, Gumi-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/170,062

(22) Filed: Jan. 31, 2014

(65) Prior Publication Data

US 2014/0148007 A1    May 29, 2014

Related U.S. Application Data

(62) Division of application No. 13/420,995, filed on Mar. 15, 2012, now abandoned.

(30) Foreign Application Priority Data

Mar. 16, 2011    (KR) .................. 10-2011-0023537

(51) Int. Cl.
*H01L 21/768*    (2006.01)
*H01L 23/31*     (2006.01)
*H01L 23/36*     (2006.01)
(Continued)

(52) U.S. Cl.
CPC ........ *H01L 21/76898* (2013.01); *H01L 21/563* (2013.01); *H01L 23/3128* (2013.01); *H01L 23/3135* (2013.01); *H01L 23/36* (2013.01); *H01L 23/481* (2013.01); *H01L 21/768* (2013.01); *H01L 23/49816* (2013.01); *H01L 2224/02372* (2013.01); *H01L 2224/0401* (2013.01); *H01L 2224/0557* (2013.01); *H01L 2224/16146* (2013.01); *H01L 2224/16225* (2013.01); *H01L 2224/16227* (2013.01); *H01L 2224/32225* (2013.01); *H01L 2224/73204* (2013.01); *H01L 2224/73253* (2013.01);
(Continued)

(58) Field of Classification Search
CPC .................... H01L 21/02063; H01L 21/768
USPC .................................................. 438/667, 672
See application file for complete search history.

(56) References Cited

U.S. PATENT DOCUMENTS

| | | | |
|---|---|---|---|
| 2006/0063375 | A1 | 3/2006 | Sun et al. |
| 2006/0076661 | A1* | 4/2006 | Savastiouk et al. ........... 257/678 |
| 2009/0243047 | A1* | 10/2009 | Wolter et al. ................. 257/621 |
| 2009/0278238 | A1* | 11/2009 | Bonifield et al. ............. 257/621 |

(Continued)

FOREIGN PATENT DOCUMENTS

| | | |
|---|---|---|
| JP | 2010-166052 A | 7/2010 |
| KR | 10-2010-0083718 A | 7/2010 |
| KR | 10-2010-0109046 A | 10/2010 |

*Primary Examiner* — Colleen A Matthews
*Assistant Examiner* — William Harriston
(74) *Attorney, Agent, or Firm* — Lee & Morse, P.C.

(57) ABSTRACT

A semiconductor device includes a substrate having a first side and a second side such that the first and second sides face each other, a through via plug penetrating the substrate, an insulating film liner, and an antipollution film. The insulating film liner is between the through via plug and the substrate and the insulating film liner has a recessed surface with respect to the second side. The antipollution film covers the second side and the antipollution film is on the recessed surface and between the through via plug and the substrate.

8 Claims, 19 Drawing Sheets

(51) Int. Cl.
*H01L 23/48* (2006.01)
*H01L 21/56* (2006.01)
*H01L 23/498* (2006.01)

(52) U.S. Cl.
CPC ............ *H01L2225/06568* (2013.01); *H01L 2924/00014* (2013.01); *H01L 2924/15311* (2013.01)

(56) References Cited

U.S. PATENT DOCUMENTS

2010/0176494 A1   7/2010   Chen
2010/0230759 A1   9/2010   Yang et al.
2011/0037144 A1*  2/2011   Chen et al. .................. 257/532

* cited by examiner

METHOD OF MANUFACTURING SEMICONDUCTOR DEVICE

CROSS-REFERENCE TO RELATED APPLICATIONS

This is a divisional application based on pending application Ser. No. 13/420,995, filed Mar. 15, 2012, the entire contents of which is hereby incorporated by reference.

Korean Patent Application No. 10-2011-00023537, the priority application herein, filed on Mar. 16, 2011, and entitled "Semiconductor Device and Method of Manufacturing the Same," is also incorporated by reference herein in its entirety.

BACKGROUND

Packaging technologies for integrated circuits have been developed to decrease a size thereof, e.g., for miniaturization, and to improve mounting reliability thereof.

SUMMARY

Embodiments may be realized by providing a semiconductor device including a substrate including a first side and a second side, the first and second sides face each other, a through via plug penetrating the substrate, an insulating film liner between the through via plug and the substrate, the insulating film liner has a recessed surface with respect to the second side, an antipollution film covering the second side, and the antipollution film is between the through via plug and a portion of the substrate on the recessed surface.

A height difference between the second side and the recessed surface may be equal to or less than a thickness of the insulating film liner. The semiconductor device may include an auxiliary insulating film on the antipollution film on the second side, the auxiliary insulating film may be adjacent to the through via plug, and the antipollution film may be between the through via plug and the auxiliary insulating film.

The semiconductor device may include transistors on the first side, and a diffusion prevention film and a seed film between the through via plug and the antipollution film and between the through via plug and the insulating film liner. The antipollution film may include a silicon nitride film. The semiconductor device may include a redistributed interconnection pattern on the second side, and the redistributed interconnection pattern may contact the through via plug.

Embodiments may also be realized by providing a method of manufacturing a semiconductor device that includes forming a through via hole in a substrate, forming an insulating film liner covering a sidewall of the through via hole, forming a through via plug filling the through via hole, exposing a bottom surface and a part of a sidewall of the insulating film liner by removing a lower portion of the substrate such that a bottom surface of the substrate is formed, removing portions of the insulating film liner on a bottom surface and a sidewall of the through via plug so as to expose a part of the sidewall of the through via hole, forming an antipollution film to cover the bottom surface of the substrate, and the bottom surface and the sidewall of the through via plug, the antipollution film is on the exposed part of the sidewall of the through via hole, and removing a part of the antipollution film and exposing the bottom surface of the through via plug by performing a planarization process.

A height of the exposed part of the sidewall of the through via hole may be equal to or less than a thickness of the insulating film liner. The method may include forming an auxiliary insulating film before performing the planarization process.

When exposing the bottom surface and the part of the sidewall of the insulating film liner, the bottom surface of the through via plug may protrude beyond the bottom surface of the substrate. Removing the lower portion of the substrate may be performed by an etch-back process selectively removing the substrate. Removing portions of the insulating film liner may be performed by an isotropic etching process selectively removing the insulating film liner.

Embodiments may be realized by providing a substrate including a first side and a second side, the first and second sides face each other, a through via plug penetrating the substrate, the through via plug includes a protruding portion that extends beyond the second side of the substrate, a diffusion prevention film between the through via plug and the substrate, the diffusion prevention film is on the protruding portion of the through via plug, an insulating film liner between the diffusion prevention film and the substrate, an antipollution film covering the second side, and the antipollution film is on the insulating film liner and is on the protruding portion of the through via plug.

The insulating film liner may be spaced apart from the second side of the substrate and the antipollution film may be between the through via plug and the second side of the substrate. The antipollution film may include a first portion covering the second side of the substrate and a second portion bent from the first portion, and the second portion may be on the protruding portion of the through via plug.

The antipollution film may include a third portion bent from the first portion, the third portion may extend in a different opposite an extending direction of the first portion, and the third portion may be between the diffusion prevention film and the substrate. A height of the third portion may be equal to or less than a thickness of the insulating film liner.

The insulating film liner may be between a portion of the diffusion prevention film on the protruding portion of the through via plug and a portion of the antipollution film on the protruding portion of the through via plug. The insulating film liner and the antipollution film may be formed of different materials. The insulating film liner may be formed of a silicon oxide film and the antipollution film may be formed of a silicon nitride film.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
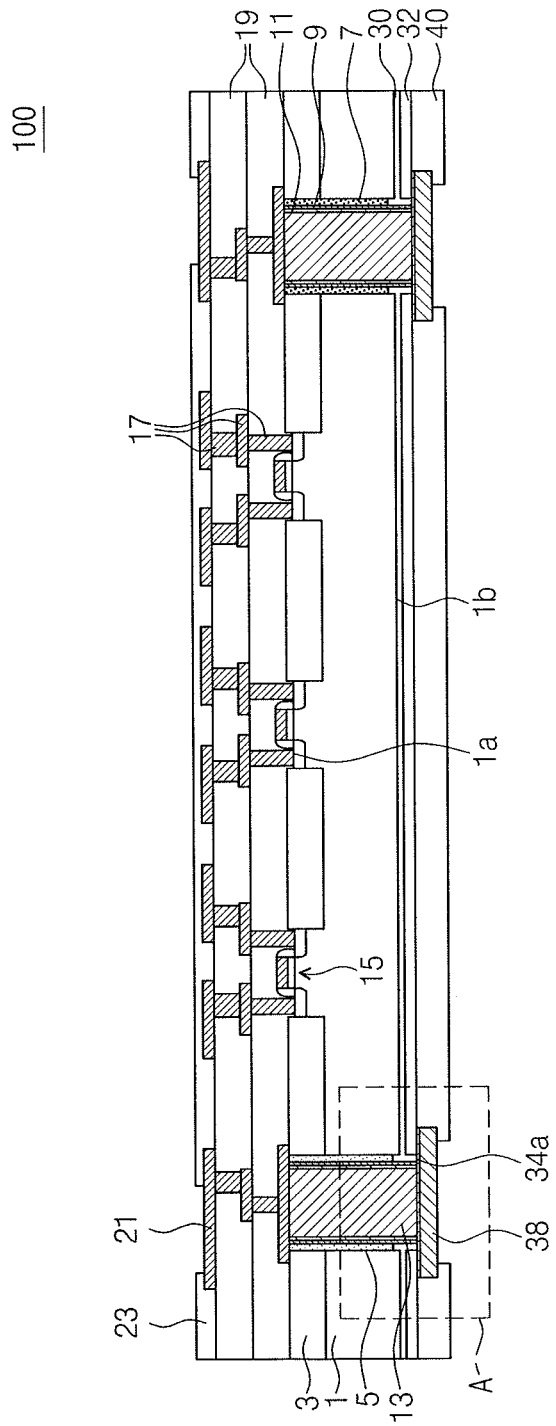
FIG. 1 illustrates a cross sectional view of a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. It will also be understood that when an element such as a layer, region or substrate is referred to as being "on" or "onto" another element, it may lie directly on the other element or intervening elements or layers may also be present.

First Exemplary Embodiment

Figure 2:
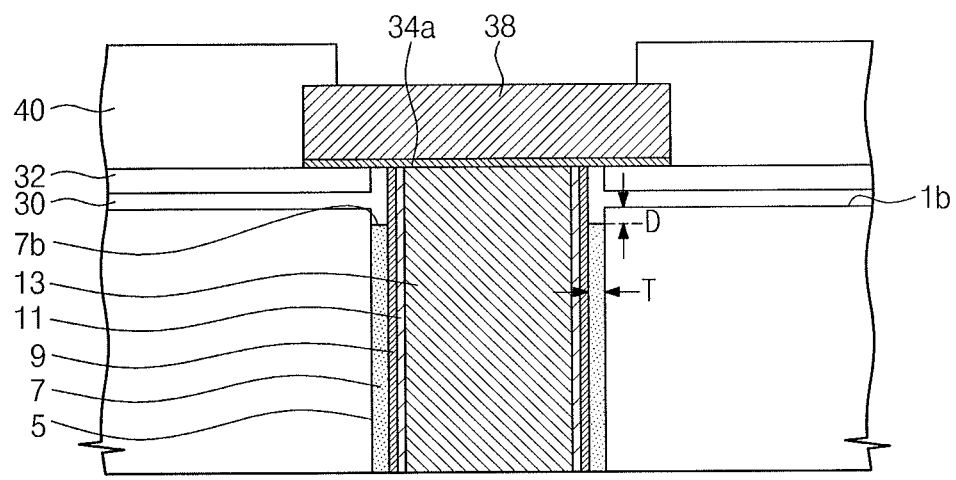
FIG. 2 illustrates an exemplary cross sectional view of "A" part of FIG. 1 as enlarged and as turned upside down.

FIG. 1 illustrates a cross sectional view of a semiconductor device in accordance with a first exemplary embodiment. FIG. 2 illustrates a cross sectional view of "A" part of FIG. 1 as enlarged and as turned upside down.

Referring to FIGS. 1 and 2, a semiconductor device 100 in accordance with the first exemplary embodiment may include a substrate 1 including a first side 1a and a second side 1b facing each other, e.g., the first side 1a and the second side 1b may be outermost sides of the substrate 1 and may form opposing sides of the substrate 1. The substrate 1 may be, e.g., a semiconductor substrate. Device isolation films 3 may be disposed at a first side 1a of the substrate 1 to define active regions. For example, upper portions of the device isolation films 3 may be surrounded by the first side 1a of the substrate 1 and the device isolation films 3 may extend into the substrate 1 in a direction toward the second side 1b.

Transistors 15 may be disposed at the active regions defined by the device isolation films 3. A plurality of interconnections 17 and a plurality of interlayer insulating films 19 may be disposed on the first side 1a. A pad 21 and a protection film 23 exposing a part of the pad 21 may be disposed on an uppermost interlayer insulating film 19. A through via 13 penetrating the substrate 1 may be disposed in the substrate 1. The through via 13 may be disposed in a through hole 5 formed in the substrate 1. The through via 13 may also extend through one of the corresponding device isolation films 3.

A seed film 11 may be disposed between the through via 13 and the substrate 1. The seed film 11 may also be disposed between the through via 13 and the corresponding device isolation film 3. The seed film 11 may contact the through via 13 and may contact the device isolation film 3. A diffusion prevention film 9 may be disposed between the seed film 11 and the substrate 1. The diffusion prevention film 9 may also be disposed between the seed film 11 and the corresponding device isolation film 3. The diffusion prevention film 9 may contact and cover, e.g., completely cover, the seed film 11. An insulating film liner 7 may be disposed between the diffusion prevention film 9 and the substrate 1. The insulating film liner 7 may be disposed between the diffusion prevention film 9 and the corresponding device isolation film 3. The insulating film liner 7 may contact and cover at least a portion of the diffusion prevention film 9.

The insulating film liner 7 may include, e.g., a silicon oxide film. The through via 13, the seed film 11, and the diffusion prevention film 9 may protrude from the second side 1b of the substrate 1, e.g., as illustrated in FIG. 2. For example, bottom surfaces of the through via 13, the seed film 11, and the diffusion prevention film 9 may downwardly protrude from the second side 1b and may be even with one another, e.g., may be horizontally aligned with each other.

The insulating film liner 7 may be adjacent to the second side 1b and may have a recessed surface 7b compared with the second side 1b, e.g., the recessed surface 7b may be spaced apart by a first predetermined distance from the second side 1b and by a second predetermined distance from the bottom surfaces of the through via 13, the seed film 11, and the diffusion prevention film 9. The recessed surface 7b may correspond to a bottom surface of the insulating film liner 7 in FIGS. 1 and 2.

An antipollution film 30 and an auxiliary insulating film 32 may be sequentially stacked on the second side 1b of the substrate 1. The antipollution film 30 may extend to be interposed between the substrate 1 and the diffusion prevention film 9 and on the recessed surface 7b of the insulating film liner 7. For example, the antipollution film 30 may fill the void between the second side 1b and recessed surface 7b. In this regard, a first portion of the antipollution film 30 may cover the second side 1b and a bent portion of the antipollution film 30 may fill the void. Also, the antipollution film 30 may extend to be interposed between the auxiliary insulating film 32 and the diffusion prevention film 9, e.g., the antipollution film 30 may include another bent portion. Accordingly, the antipollution film 30 may include a first portion that covers the second side 1b, a first protrusion portion in the void on recessed surface 7b, and a second protrusion portion overlapping the first protrusion portion and arranged between the auxiliary insulating film 32 and the diffusion prevention film 9. As such, the antipollution film 30 may cover the second side 1b of the substrate 1 and the recessed surface 7b of the insulating film liner film 7 at the same time.

The antipollution film 30 may include a material, e.g., a silicon nitride film, that may reduce the possibility of and/or prevent diffusion of copper ion. The antipollution film 30 may include a silicon oxide film. A height difference D, e.g., a distance, between the second side 1b and the recessed surface 7b may be equal to or smaller than a thickness T of the insulating film liner 7. Accordingly, the degree that the antipollution film 30 is interposed between the through via 13 and the substrate 1 may be limited. Based on, e.g., a shape and a composition, the antipollution film 30 may reduce the possibility of and/or prevent copper ions from permeating the substrate 1 through surrounding layers and generating a leakage current.

In the case that the antipollution film 30 is formed of a silicon nitride film, since the silicon nitride film has a high dielectric constant of about 7.0, a parasitic capacitance may become high between the through via 13 and the substrate 1. However, since the insulating film liner 7 is interposed between the through via 13 and the substrate 1, a parasitic capacitance between the through via 13 and the substrate 1 may be minimized. That is, the degree that the antipollution 30 is interposed between through via 13 and the substrate 1 limited according to a relation between the height difference D and the thickness T may reduce the possibility of and/or prevent contamination of copper ion and may minimize a parasitic capacitance.

A redistributed interconnection pattern 38 may overlap the through via 13 and may be disposed on the second side 1b of the substrate 1. A redistributed interconnection seed film pattern 34a may be interposed between the redistributed interconnection pattern 38 and the through via 13. The redistributed interconnection pattern 38 and the redistributed interconnection seed film pattern 34a may extend to overlap portions of the second side 1b surrounding the through via 13.

A passivation film 40 may be disposed on the auxiliary insulating film 32 of both sides of the redistributed interconnection pattern 38. The passivation film 40 may be formed of, e.g., an organic insulating film such as polyimide. The passivation film 40 may cover lateral sides of the redistributed interconnection pattern 38.

Figure 3:
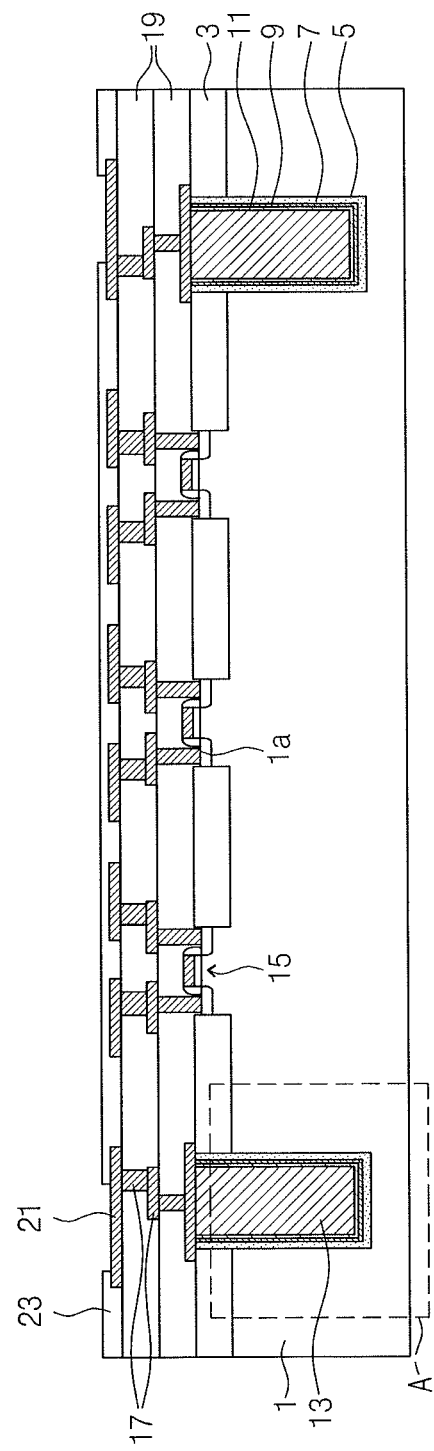
FIG. 3 illustrates a cross sectional view depicting a stage in manufacturing a semiconductor device, according to an exemplary embodiment.
Figure 4:
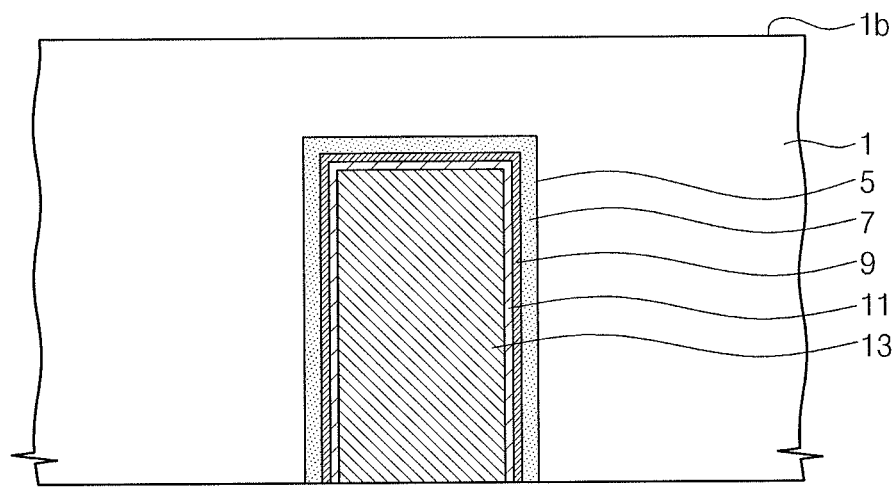
FIG. 4 illustrates an exemplary cross sectional view of "A" part of FIG. 3 as enlarged and as turned upside down.

FIG. 3 illustrates a cross sectional view depicting a stage in a process of manufacturing a semiconductor device. FIG. 4 illustrates a cross sectional view of part "A" of FIG. 3 as enlarged and as turned upside down. FIGS. 5 through 11 illustrate enlarged cross sectional views depicting various stages in a process of manufacturing the semiconductor device of FIG. 2.

Referring to FIGS. 3 and 4, a through via hole 5 may be formed in a substrate 1 including a first side 1a and a second side 1b that face each other. The through via hole 5 may be formed in the substrate 1 from the first side 1a and may be spaced apart from the second side 1b. The insulating film liner 7 may be formed, e.g., conformally formed, on an entire surface of the first side 1a of the substrate 1 in which the through via hole 5 is formed. The insulating film liner 7 may be formed of a silicon oxide film. The diffusion prevention film 9 and the seed film 11 may be formed, e.g., sequentially formed, on the insulating film liner 7. The diffusion prevention film 7 may be formed of at least one of a titanium film, a titanium nitride film, a tantalum film, and a tantalum nitride film.

The seed film 11 may be formed of, e.g., copper. A copper film may be formed on the seed film 11 using a plating process to fill the through via hole 5. A planarization process may be performed on the copper film to form the through via plug 13 in the through via hole 5. The first side 1a of the substrate 1 or the insulating film liner 7 may be exposed by the planarization process. The device isolation film 3 may be formed at the first side 1a of the substrate 1 to define active regions. A plurality of the transistors 15 may be formed in the defined active regions. A plurality of the interlayer insulating films 19 and the interconnections 17 may be formed on the first side 1a of the substrate 1. The pad 21 and the protection film 23 exposing a part of the pad 21 may be formed on the uppermost interlayer insulating film 19.

Figure 5:
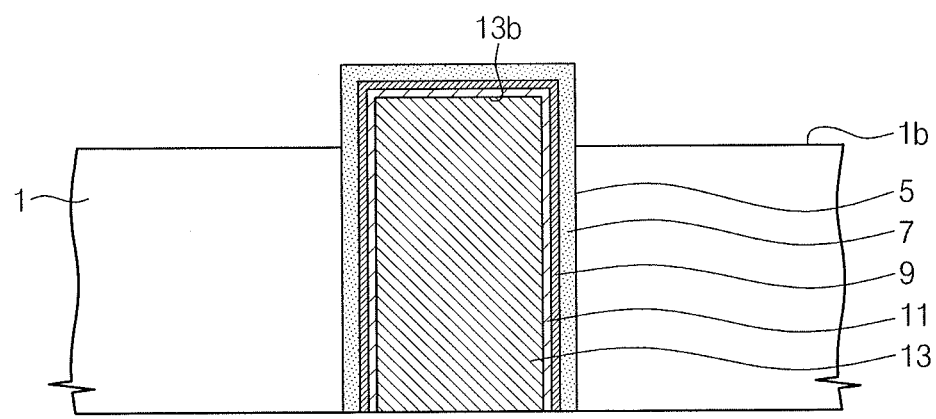
FIGS. 5 through 11 illustrate enlarged cross sectional views depicting stages in an exemplary process of manufacturing the semiconductor device of FIG. 2.

Referring to FIGS. 4 and 5, a part of the substrate 1 adjacent to the second side 1b is removed to expose a bottom surface of the insulating film liner 7. For example, an etch-back process selectively removing the substrate 1 may be performed. The etch-back process may be performed continuously until a bottom surface of the through via plug 13 becomes higher than the second side 1b of the substrate 1 so that the through via plug 13 protrudes at a predetermined distance away from the second side 1b.

Figure 6:
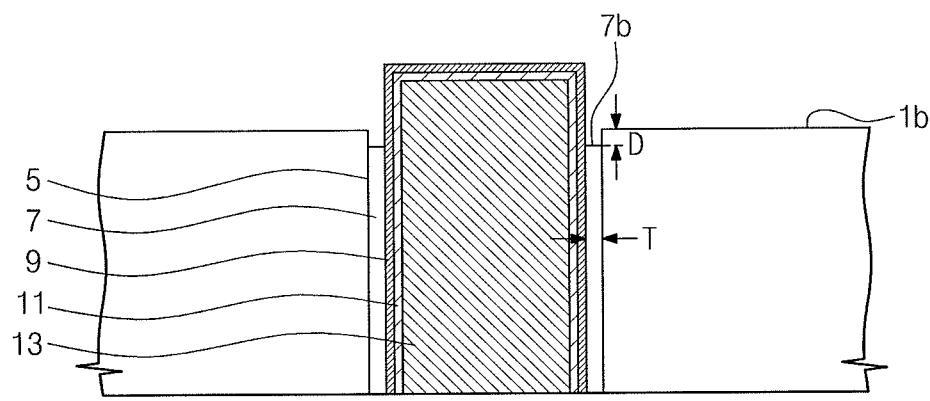

Referring to FIG. 6, the exposed insulating film liner 7 may be selectively removed. For example, an isotropic etching process selectively removing only the insulating film liner 7 may be performed. In the case that the insulating film liner 7 is formed of a silicon oxide film, a wet etching process using hydrofluoric may be performed. By the isotropic etching process, a part of sidewall of the substrate 1 is exposed and the insulating film liner 7 may be formed to have the recessed surface 7b compared with the second side 1b of the substrate 1. A height difference D between the second side 1b and the recessed surface 7b may be equal to or smaller than a thickness T of the insulating film liner 7.

Figure 7:
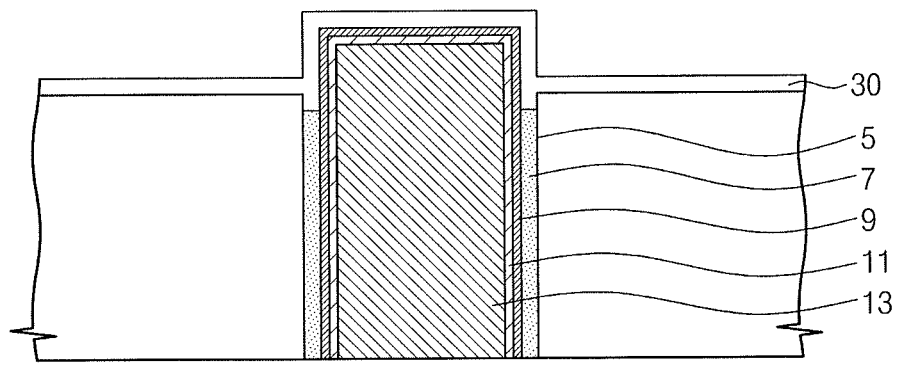

Referring to FIG. 7, the antipollution film 30 may be conformally formed on the second side 1b of the substrate 1. The antipollution film 30 may be formed of a silicon nitride film. The antipollution film 30 may be interposed between the through via plug 13 and the substrate 1 on the recessed surface 7b of the insulating film liner 7.

Figure 8:
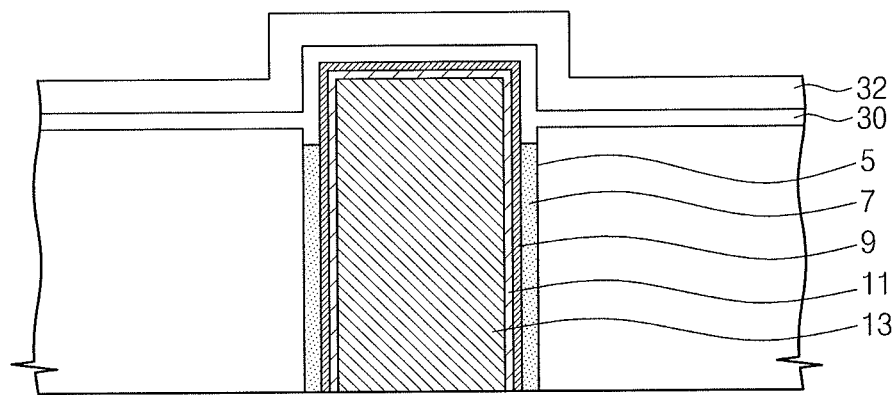

Referring to FIG. 8, the auxiliary insulating film 32 may be formed on the antipollution film 30. The auxiliary insulating film 32 may be a silicon oxide film.

Figure 9:
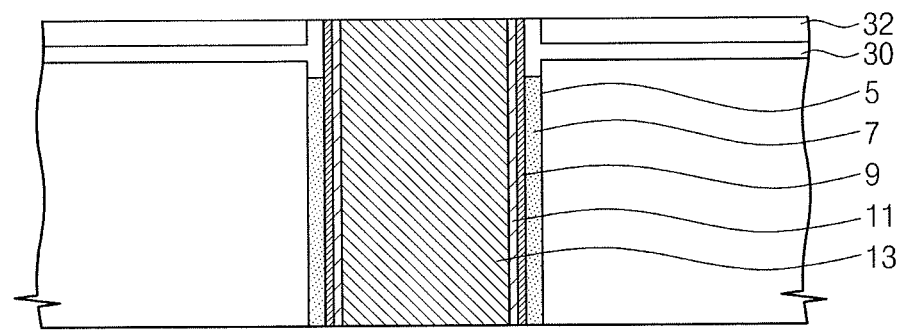

Referring to FIG. 9, a planarization process may be performed to expose the through via plug 13. For example, the planarization process may be a chemical mechanical polishing process. The auxiliary insulating film 32 and the antipollution film 30 that cover the bottom surface of the through via plug 13 may be removed by the planarization process. During the planarization process, a portion of the through via plug 13 protruding beyond the second side 1b of the substrate 1 may also be removed. Although the through via plug 13 formed of copper may be exposed by the planarization process, copper ions may not come into contact with the substrate 1 and the insulating film liner 17 by the antipollution film 30. Thus, the copper ions may not be able to diffuse into the substrate 1. After the planarization process, an exposed surface of the auxiliary insulating film 32, an exposed protrusion of the antipollution film 30, the bottom surfaces of the diffusion prevention film 9 and the seed film 11, and the exposed surface of the through via plug 13 may be horizontally aligned.

Figure 10:
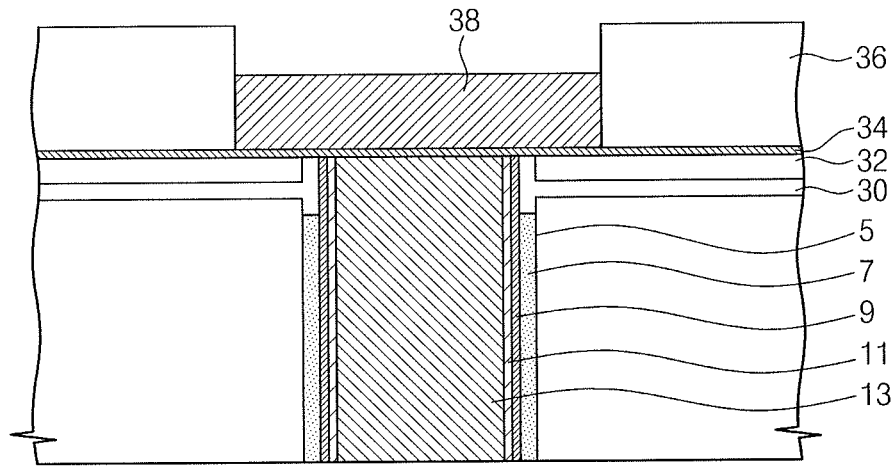

Referring to FIG. 10, a redistributed interconnection seed film 34 may be formed on the planarized through via plug 13 and the planarized auxiliary insulating film 32. A photoresist pattern 36 limiting a redistributed interconnection pattern may be formed on the redistributed interconnection seed film 34. The redistributed interconnection pattern 38 may be formed on the redistributed interconnection seed film 34 exposed by the photoresist pattern 36 by performing, e.g., a plating process.

Figure 11:
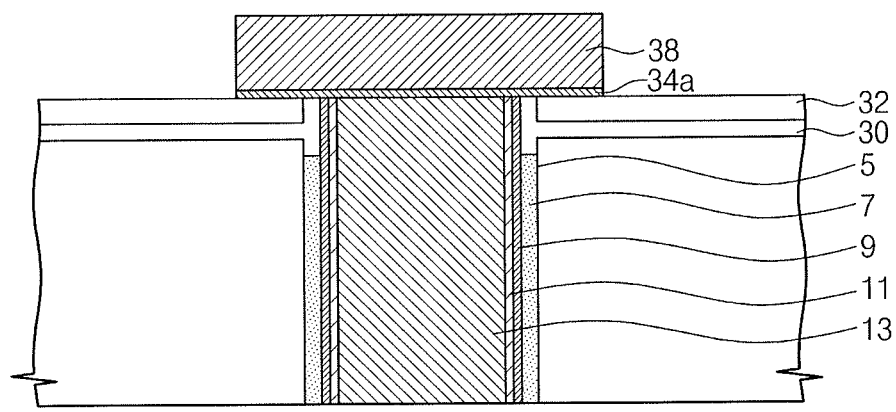

Referring to FIG. 11, the photoresist pattern 36 may be removed. Further, the redistributed interconnection seed film 34 adjacent to both sides of the redistributed interconnection pattern 38 may be removed to form the redistributed interconnection seed pattern 34a under the redistributed interconnection pattern 38.

Subsequently, referring to FIG. 2, the semiconductor device of FIG. 2 may include the passivation film 40 partly exposing the redistributed interconnection pattern 38.

The semiconductor device 100 including the antipollution film 30 may be a semiconductor chip such as a logic chip or a memory chip, or an interposer. In the case that the semiconductor device 100 is an interposer, it may not include a transistor.

Second Exemplary Embodiment

Figure 12:
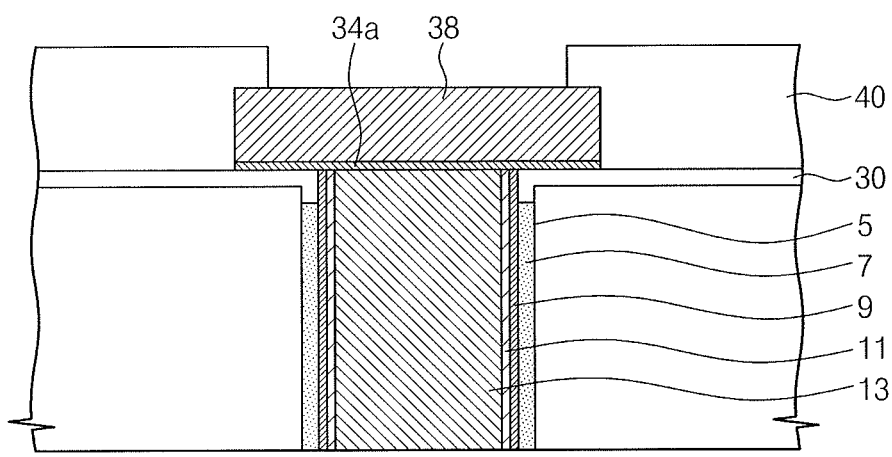
FIG. 12 illustrates an enlarged cross sectional view of a semiconductor device, according to an exemplary embodiment.

FIG. 12 illustrates an enlarged cross sectional view of a semiconductor device in accordance with a second exemplary embodiment.

Referring to FIG. 12, a semiconductor device in accordance with the second embodiment does not include the auxiliary insulating film 32 of the first exemplary embodiment. For example, the antipollution film 30 may directly contact the redistributed interconnection seed pattern 34a and the passivation film 40. An exposed surface of the antipollution film 30 may be horizontally aligned with the bottom surfaces of the diffusion prevention film 9 and the seed film 11.

The semiconductor device may be formed by forming the antipollution film 30 of FIG. 7 of the first exemplary embodiment and then performing a planarization process, e.g., similar to that illustrated in FIG. 9, without forming the auxiliary insulating film 32 of FIG. 8. A structure and a manufacturing process except those described above may be substantially the same as or similar to the first exemplary embodiment.

Third Exemplary Embodiment

Figure 13:
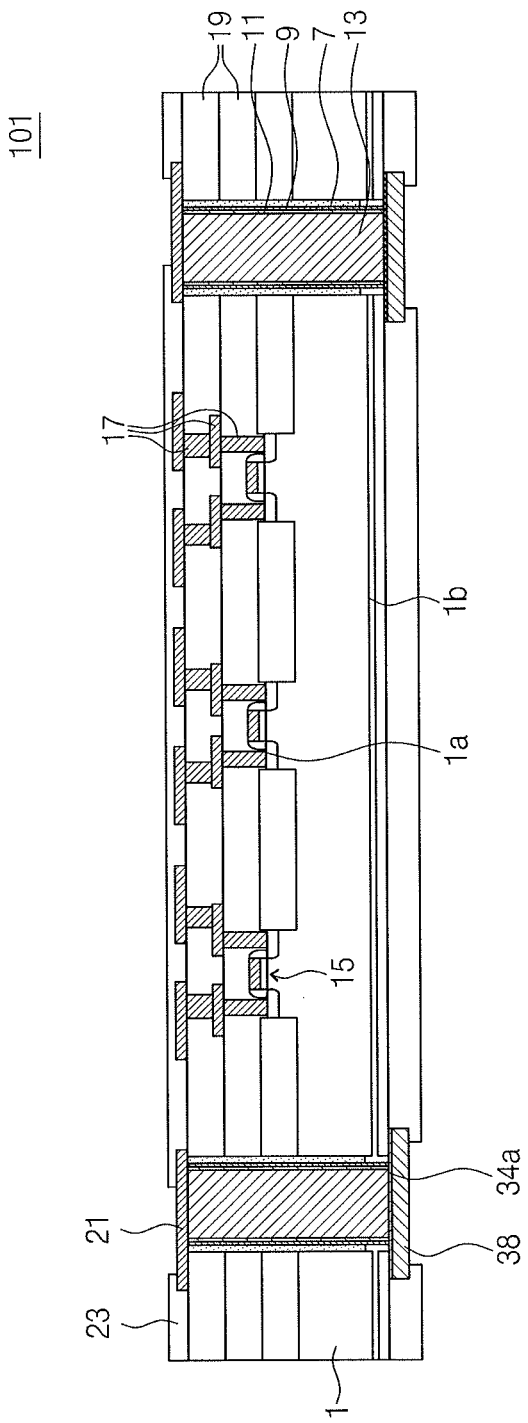
FIGS. 13-19 illustrate cross sectional views of semiconductor devices, according to exemplary embodiments.

FIG. 13 illustrates a cross sectional view of a semiconductor device in accordance with a third exemplary embodiment.

Referring to FIG. 13, in a semiconductor device 101, the through via plug 13 may extend through and penetrate the substrate 1 and the interlayer insulating films 19 to contact the pad 21. As a result of this, the insulating film liner 7, the diffusion prevention film 9, and the seed film 11 may also extend and penetrate the interlayer insulating films 19. For example, the through via plug 13, the insulating film liner 7, the diffusion prevention film 9, and the seed film 11 may be formed after the interlayer insulating films 19 are formed. A structure and a manufacturing process except those described above may be substantially the same as or similar to the first exemplary embodiment.

Fourth Exemplary Embodiment

Figure 14:
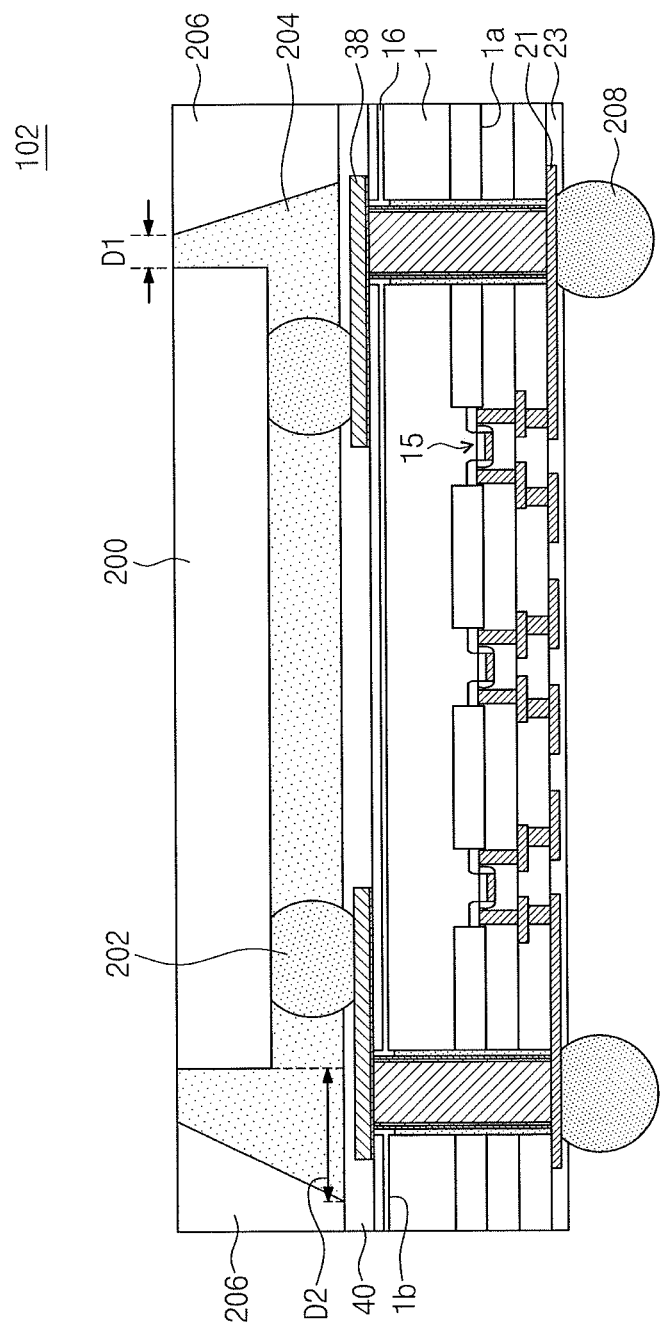

FIG. 14 illustrates a cross sectional view of a semiconductor device in accordance with a fourth exemplary embodiment.

Referring to FIG. 14, a semiconductor device 102 may include a semiconductor package structure in which another semiconductor chip 200 is stacked on the semiconductor device 101 of the third exemplary embodiment, which is turned upside down. For example, the semiconductor chip 200 may be mounted on the second side 1b of the substrate 1.

The semiconductor chip 200 may be electrically connected to the semiconductor device 101 by, e.g., the redistributed interconnection pattern 38 and a first conductive means 202. A second conductive means 208 may adhere to the pad 21 disposed on the first side 1a of the substrate 1. The first conductive means 202 and the second conductive means 208 may include at least one of a conductive bump, a conductive spacer, a solder ball, and a pin grid array.

An underfill film 204 may be interposed between the semiconductor chip 200 and the passivation film 40. The underfill film 204 may extend to cover sidewalls of the semiconductor chip 200 and a top surface of the passivation film 40 adjacent to the sidewalls of the semiconductor chip 200. The underfill film 204 may have an inclined side. The inclined side of the underfill film 204 and a top surface of the passivation film 40 adjacent to the inclined side of the underfill film 204 may be covered with a molding film 206. Top surfaces of the molding film 206, the underfill film 204 and the semiconductor chip 200 may be even with one another. The molding film 206 may be processed at a wafer level.

The underfill film 204 may have a thermal expansion coefficient greater than a thermal expansion coefficient of the semiconductor chip 200 and smaller than a thermal expansion coefficient of the molding film 206. Accordingly, an interface detachment danger due to, e.g., a thermal expansion coefficient between the semiconductor chip 200 and the molding film 206, may be reduced. Also, a contact area may be obtained while the molding film 206 contacts the underfill film 204. A thickness D1 of the underfill film 204 in a horizontal direction from a top end of the semiconductor chip 200 may be, e.g., about 5 μm. As such, a detachment danger among the semiconductor chip 200, the underfill film 204, and the molding film 206 may be minimized. A thickness D2 of the underfill film 204 in a horizontal direction from a bottom end of the semiconductor chip 200 may be, e.g., about 700 μm or less such that the thickness D2 is greater than the thickness D1. Accordingly, a contact area between the molding film 206 and the passivation film 40 may be maximally obtained. A structure except those described above may be substantially the same as or similar to the first exemplary embodiment.

Fifth Exemplary Embodiment

Figure 15:
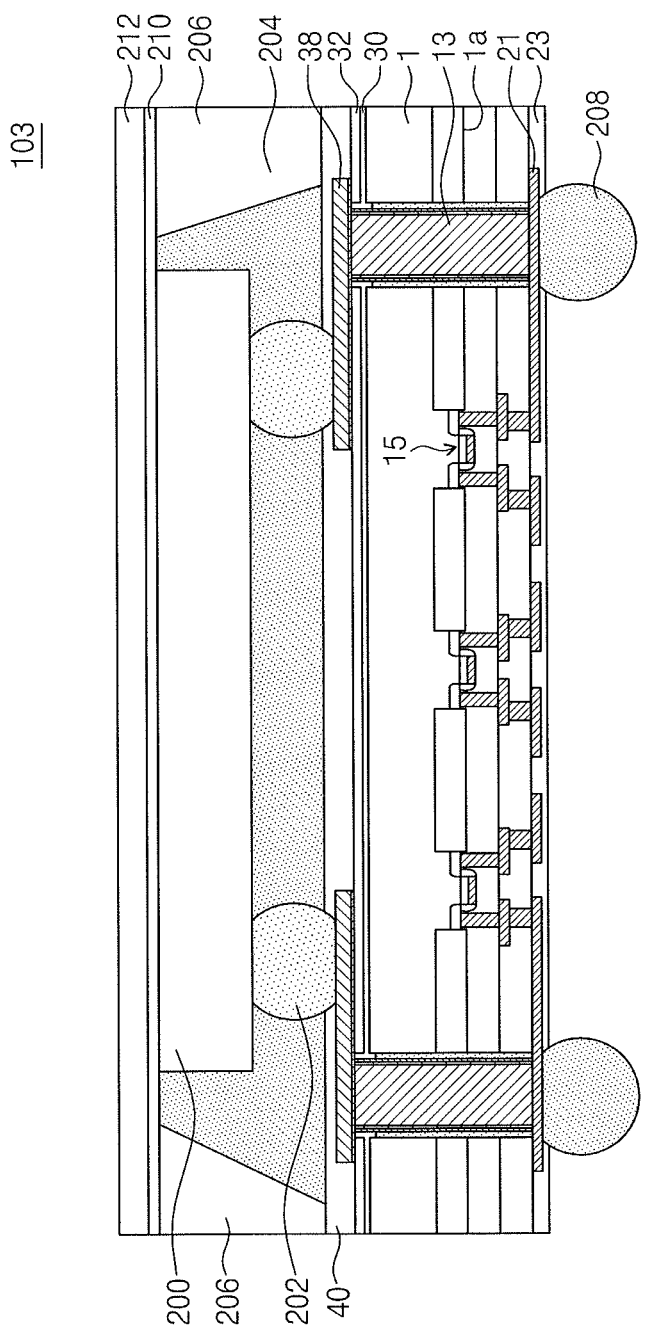

FIG. 15 illustrates a cross sectional view of a semiconductor device in accordance with a fifth exemplary embodiment.

Referring to FIG. 15, a semiconductor device 103 may have a semiconductor package structure in which a thermal interface material 210 and a heat sink 212 are disposed on the semiconductor device 102 of the fourth exemplary embodiment. For example, the thermal interface material 210 and the heat sink 212 may be sequentially stacked on top surfaces of the semiconductor chip 202, the underfill film 204, and the molding film 206. A sclerotic adhesive such that particles of metal system such as silver or particles of metal oxide system such as alumina ($Al_2O_3$) may be included in an epoxy resin. Thermal grease of paste type including particles such as diamond, aluminum nitride (AlN), alumina ($Al_2O_3$), zinc oxide (ZnO), silver (Ag), etc. may be used as the thermal interface material 210. The heat sink 212 may be a material having a high thermal conductivity and may include, e.g., a metal plate. A structure except those described above may be substantially the same as or similar to the fourth exemplary embodiment.

Sixth Exemplary Embodiment

Figure 16:
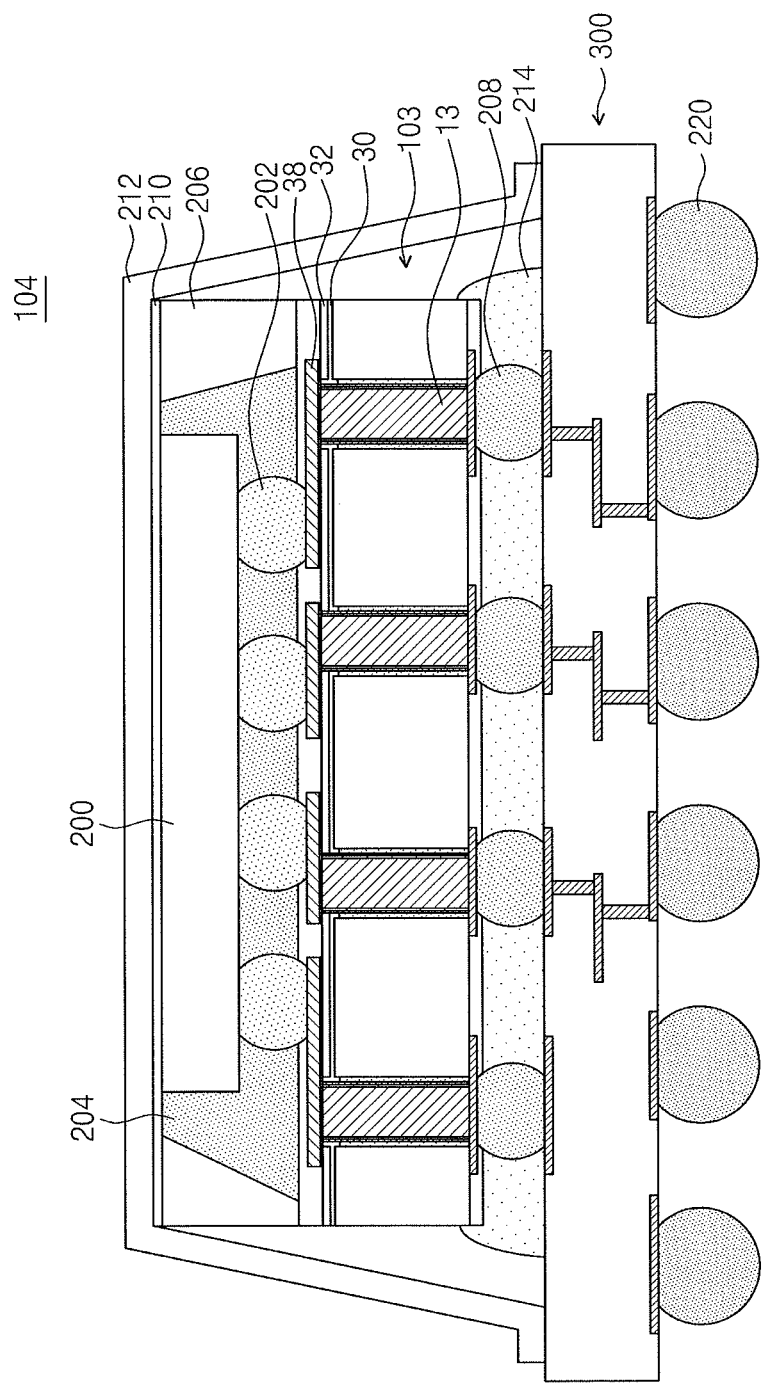

FIG. 16 illustrates a cross sectional view of a semiconductor device in accordance with a sixth exemplary embodiment.

Referring to FIG. 16, a semiconductor device 104 may include a semiconductor package structure in which the semiconductor device 103 of the fifth exemplary embodiment is mounted on a package substrate 300. For example, the through via plug 13 and the antipollution film 30 may be mounted on the package substrate 300 by the second conductive means 208. The semiconductor chip 200 may be mounted in the semiconductor device 104 by the first conductive means 202. An underfill resin 214 may fill a space between the semiconductor device 103 and the package substrate 300.

The heat sink 212 may have a lid shape covering the semiconductor chip 200 and the semiconductor device 103. A lower portion of the heat sink 212 may contact a top surface of the package substrate 300 so that the heat sink 212 surrounds the semiconductor device 104. Although not illustrated in the drawing, the heat sink 212 may be electrically connected to a ground plate disposed in, e.g., the package substrate 300. A third conductive means 220 may be connected to a bottom surface of the package substrate 300. A structure except those described above may be substantially the same as or similar to the fifth embodiment.

Seventh Exemplary Embodiment

Figure 17:
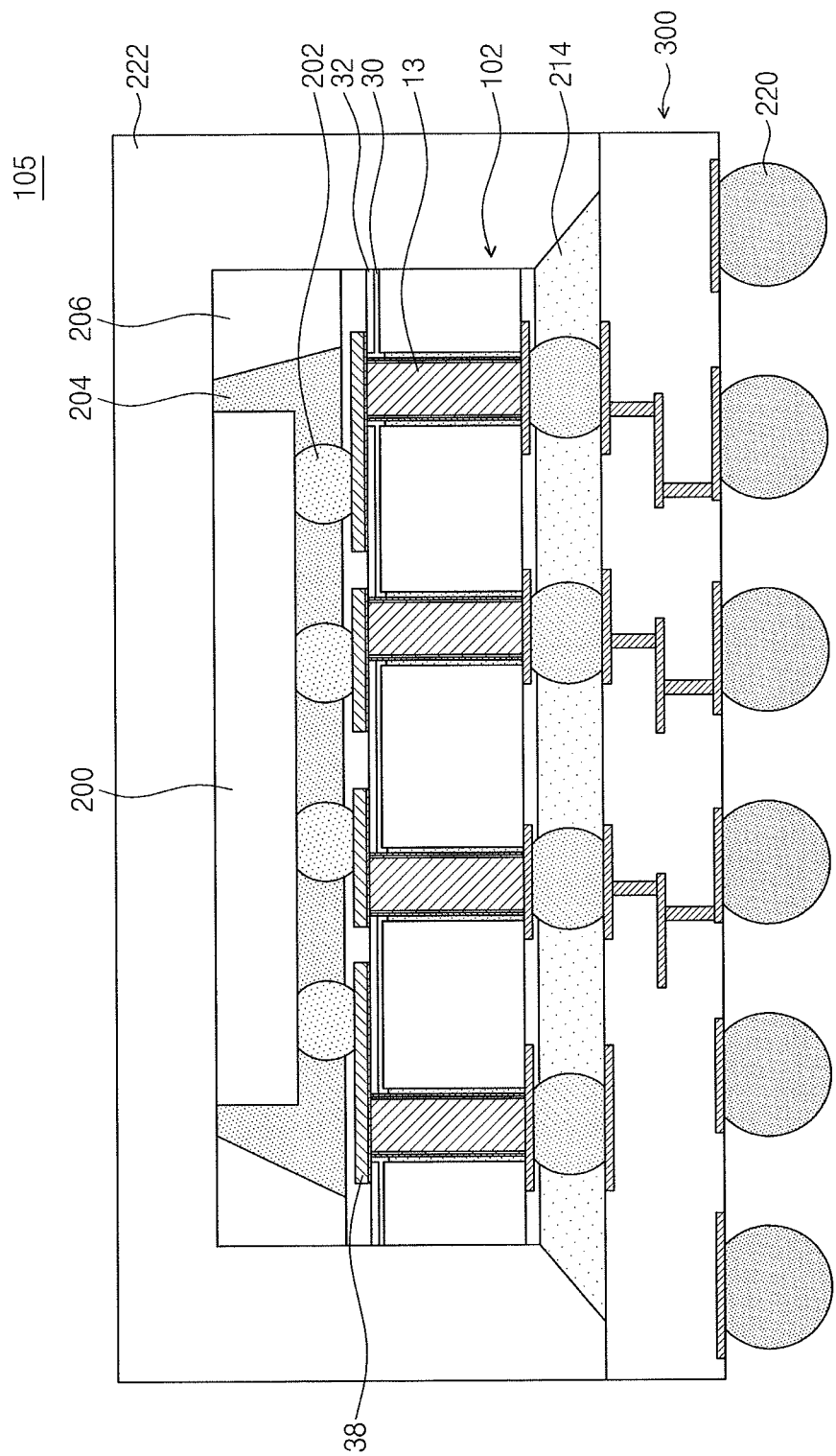

FIG. 17 illustrates a cross sectional view of a semiconductor device in accordance with a seventh exemplary embodiment.

Referring to FIG. 17, a semiconductor device 105 may include a semiconductor package structure in which the semiconductor device 104 of the sixth exemplary embodiment, which includes the semiconductor device 102 of the fourth exemplary embodiment, is covered with an over mold film 222 without the thermal interface material 210 and the heat sink 212. For example, the through via plug 13 and the antipollution film 30 may be mounted on the package substrate 300 by the second conductive means 208. The semiconductor chip 200 may be mounted in the semiconductor device 102 by the first conductive means 202. A space between the semiconductor device 102 and the package substrate 300 may be filled with the underfill resin 214. Top surfaces of the semiconductor chip 200, the underfill film 204, the mold film 206, and the package substrate 300 and sidewalls of the semiconductor device 102 may be covered with the over mold film 222. A structure except those described above may be substantially the same as or similar to the sixth exemplary embodiment.

Eight Exemplary Embodiment

Figure 18:
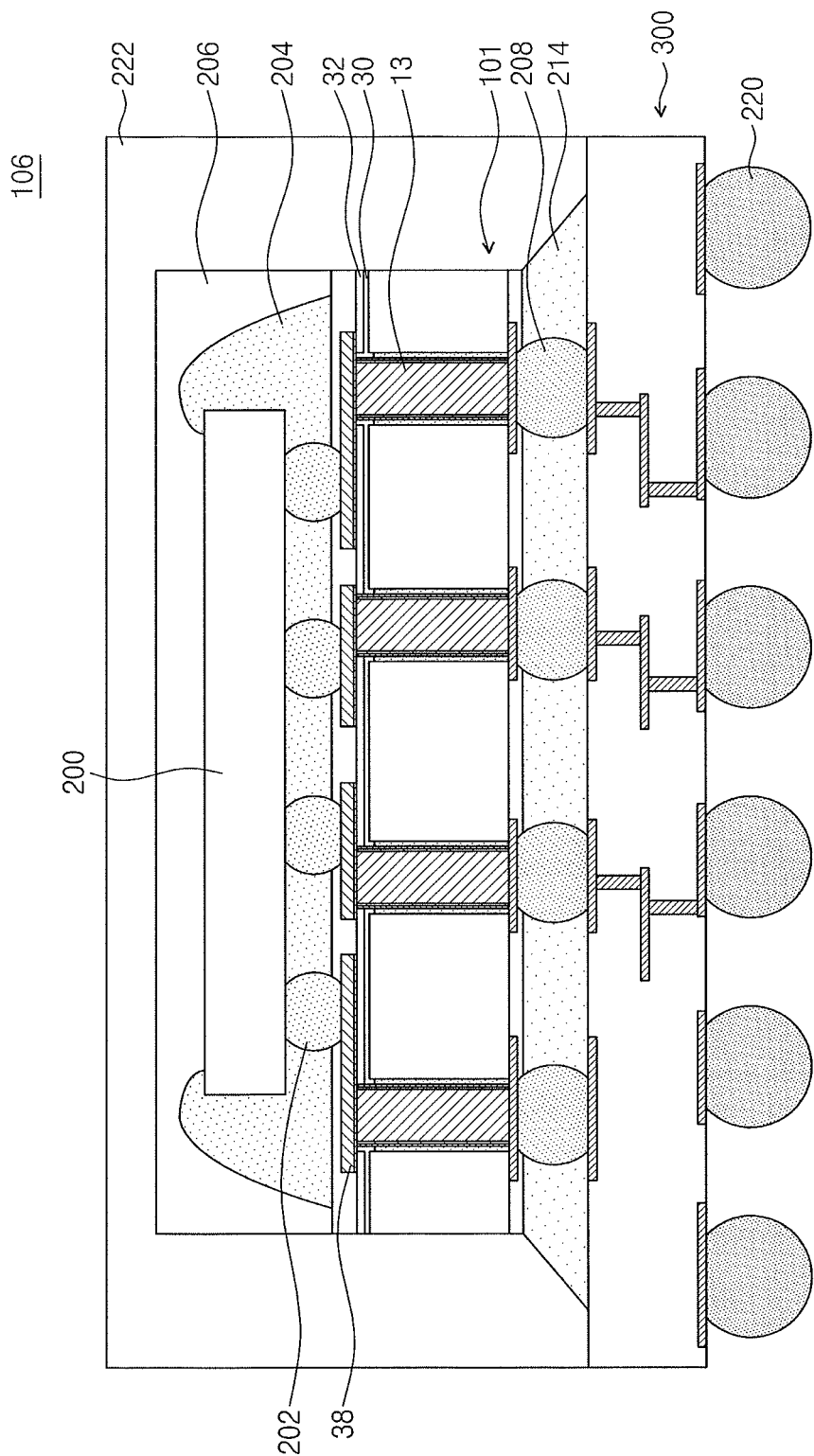

FIG. 18 illustrates a cross sectional view of a semiconductor device in accordance with an eighth exemplary embodiment.

Referring to FIG. 18, a semiconductor device 106 of the eighth embodiment is similar to the semiconductor device 105 of FIG. 7 but shapes of the mold film 206 and the underfill film 204 of the semiconductor device 106 are different from those of the semiconductor device 105. For example, the underfill film 204 may cover sidewalls of the semiconductor chip 200 and a part of top surface of the semiconductor chip 200 adjacent to the sidewalls of the semiconductor chip 200. A top surface of the underfill film 204 may protrude compared with a top surface of the semiconductor chip 200. The mold film 206 may cover the top surface of the semiconductor chip 200 and the underfill film 204. A structure except those described above may be substantially the same as or similar to the seventh exemplary embodiment.

Ninth Exemplary Embodiment

Figure 19:
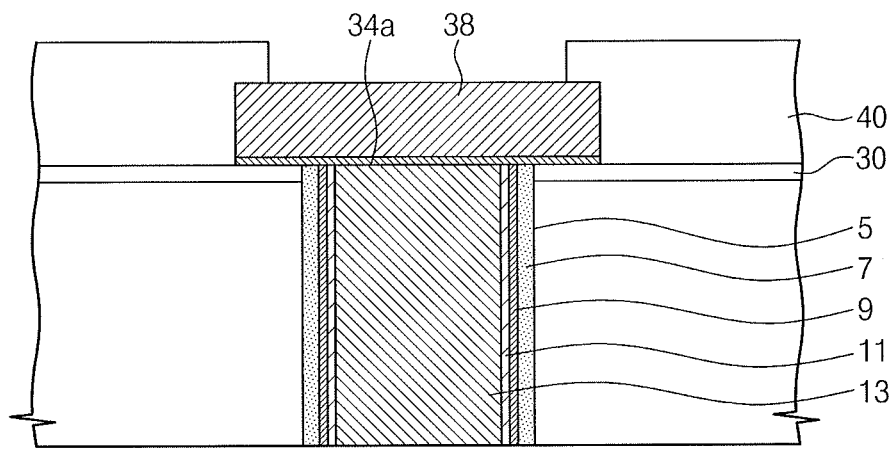

FIG. 19 illustrates a cross sectional view of a semiconductor device in accordance with a ninth exemplary embodiment.

Referring to FIG. 19, the insulating film liner 7 may be interposed between the antipollution film 30 and the through via plug 13. That is, unlike the first exemplary embodiment, the insulating film liner 7 does not have a recessed surface compared with the second side 1b of the substrate 1. Also, the auxiliary insulating film 32 (not illustrated) may be included or excluded. A structure except those described above may be substantially the same as or similar to the first exemplary embodiment.

Figure 20:
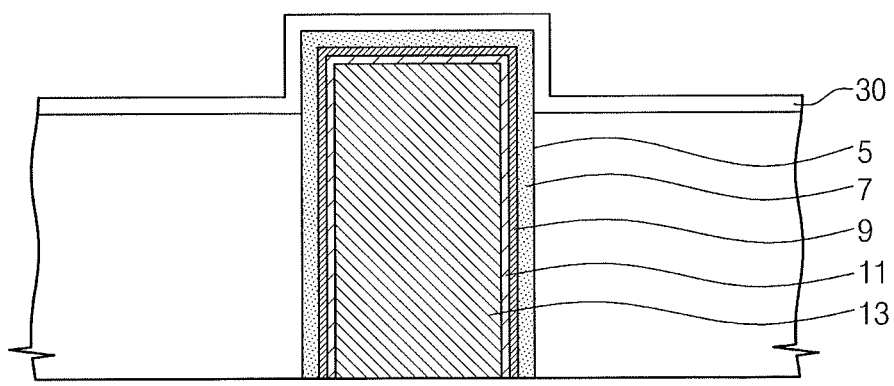
FIGS. 20 and 21 illustrate enlarged cross sectional views depicting stages in an exemplary process of manufacturing the semiconductor device of FIG. 19.
Figure 21:
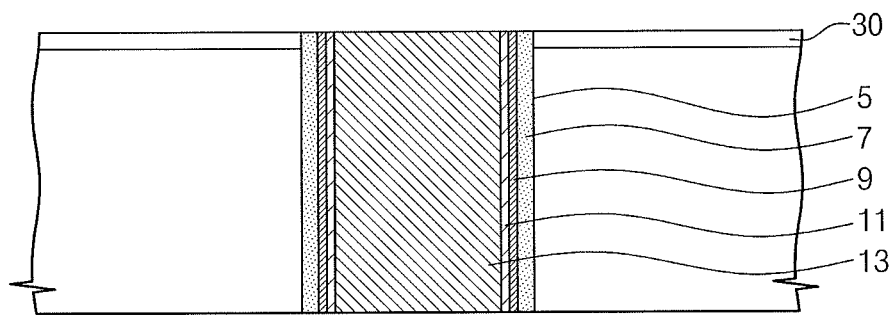

FIGS. 20 and 21 illustrate enlarged cross sectional views depicting stages in a process of manufacturing the semiconductor device of FIG. 19.

Referring to FIG. 20, the antipollution film 30 may be formed, e.g., conformally formed, on an entire surface of FIG. 5 of the first exemplary embodiment without removing a part of the insulating film liner 7.

Referring to FIG. 21, a planarization process may be performed to remove the antipollution film 30 and the insulating film liner 7 on the through via plug 13, thereby exposing the through via plug 13. During the planarization process, portions of the diffusion prevention film 9 and the seed film 11 on the through via plug 13 may also be removed. The semiconductor device of FIG. 19 may be manufactured by subsequently performing a process substantially the same as or similar to the first exemplary embodiment.

Tenth Exemplary Embodiment

Figure 22:
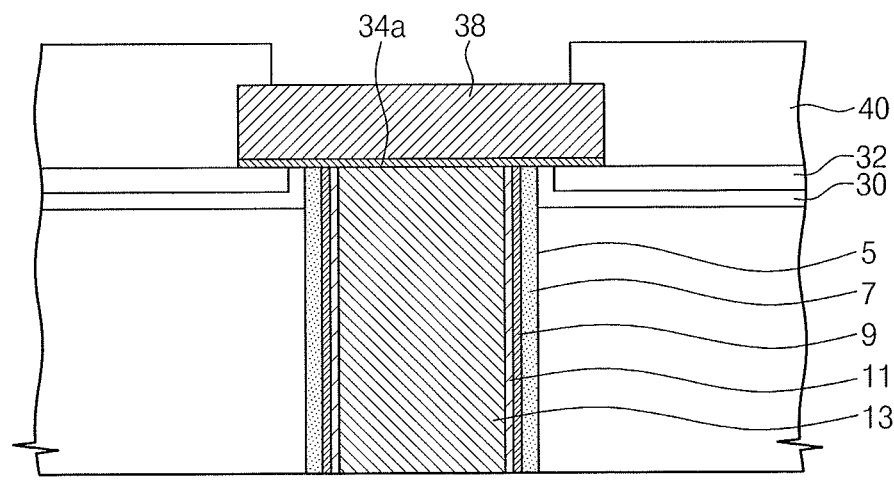
FIG. 22 illustrates an enlarged cross sectional view of a semiconductor device, according to an exemplary embodiment.

FIG. 22 illustrates an enlarged cross sectional view of a semiconductor device in accordance with a tenth exemplary embodiment.

Referring to FIG. 22, the insulating film liner 7 may be interposed between the antipollution film 30 and the through via plug 13. The antipollution film 30 may extend, e.g., may have a protruding portion interposed between the auxiliary insulating film 32 and the insulating film liner 7. A structure except those described above may be substantially the same as or similar to the ninth exemplary embodiment.

Figure 23:
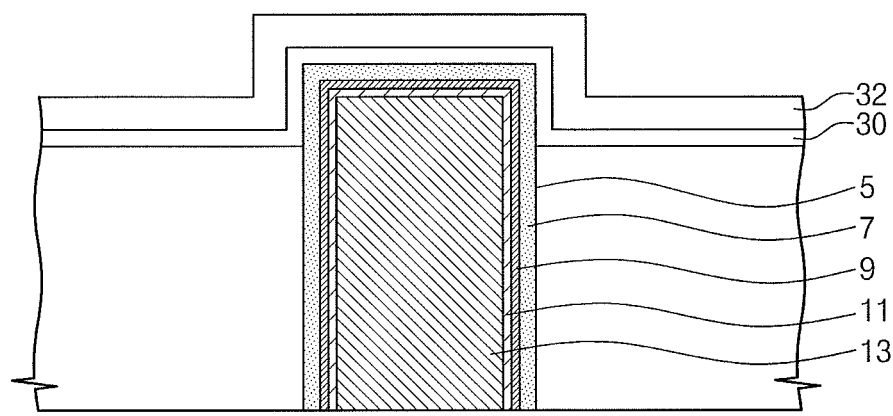
FIG. 23 illustrates an enlarged cross sectional view depicting a stage in an exemplary process of manufacturing the semiconductor device of FIG. 22.

FIG. 23 illustrates an enlarged cross sectional view showing a process of manufacturing the semiconductor device of FIG. 22.

Referring to FIG. 23, the antipollution film 30 and the insulating film liner 7 may be sequentially and conformally formed on an entire surface of FIG. 5 of the first exemplary embodiment without removing a part of the insulating film liner 7. A planarization process may be performed to remove the auxiliary insulating film 32, the antipollution film 30, and the insulating film liner 7 on the through via plug 13, thereby exposing the through via plug 13. The semiconductor device of FIG. 22 may be manufactured by subsequently performing a process substantially the same as or similar to the first exemplary embodiment.

Eleventh Exemplary Embodiment

Figure 24:
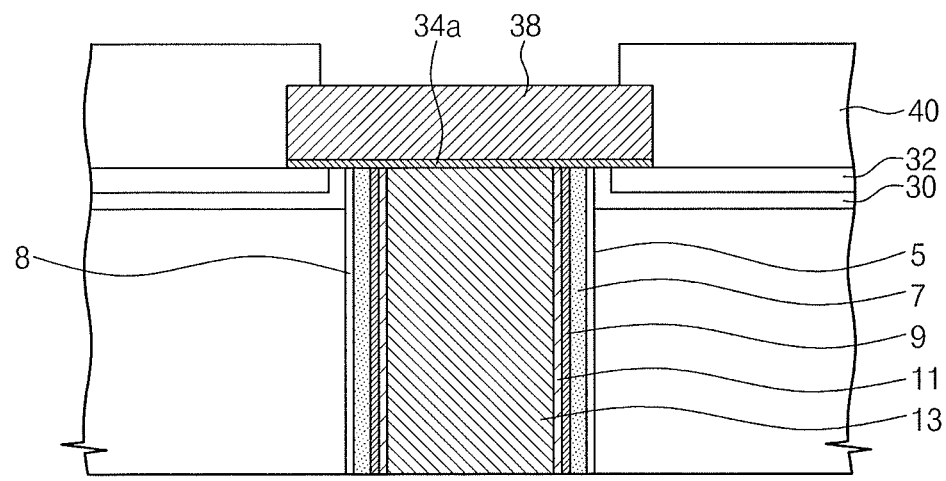
FIG. 24 illustrates an enlarged cross sectional view of a semiconductor device, according to an exemplary embodiment.

FIG. 24 illustrates an enlarged cross sectional view of a semiconductor device in accordance with an eleventh exemplary embodiment.

Referring to FIG. 24, an antipollution liner 8 may be interposed between the insulating film liner 7 and the substrate 1. The antipollution liner 8 may extend to be interposed between the antipollution film 30 and the insulating film liner 7. The antipollution liner 8 may be formed of, e.g., a silicon nitride film. Unlike the first exemplary embodiment, the insulating film liner 7 may not have a recessed surface compared with the second side 1b of the substrate 1. Further, the antipollution liner 8 may cover the insulating film liner 7 such that the each of the antipollution liner 8, the insulating film liner 7, the diffusion prevention film 9, and the seed film 11 are even with each other, e.g., horizontally aligned, adjacent to an outermost surface of the auxiliary insulating film 32 and/or the antipollution film 30.

The semiconductor device of FIG. 24 may be formed by forming the through via hole 5, forming the antipollution liner 8 before forming the insulating film liner 7, and then performing a process similar to that of the ninth exemplary embodiment. A structure except those described above may be substantially the same as or similar to the tenth exemplary embodiment.

The semiconductor device technology described above may be applied to various kinds of semiconductor devices and package modules including semiconductor devices.

Figure 25:
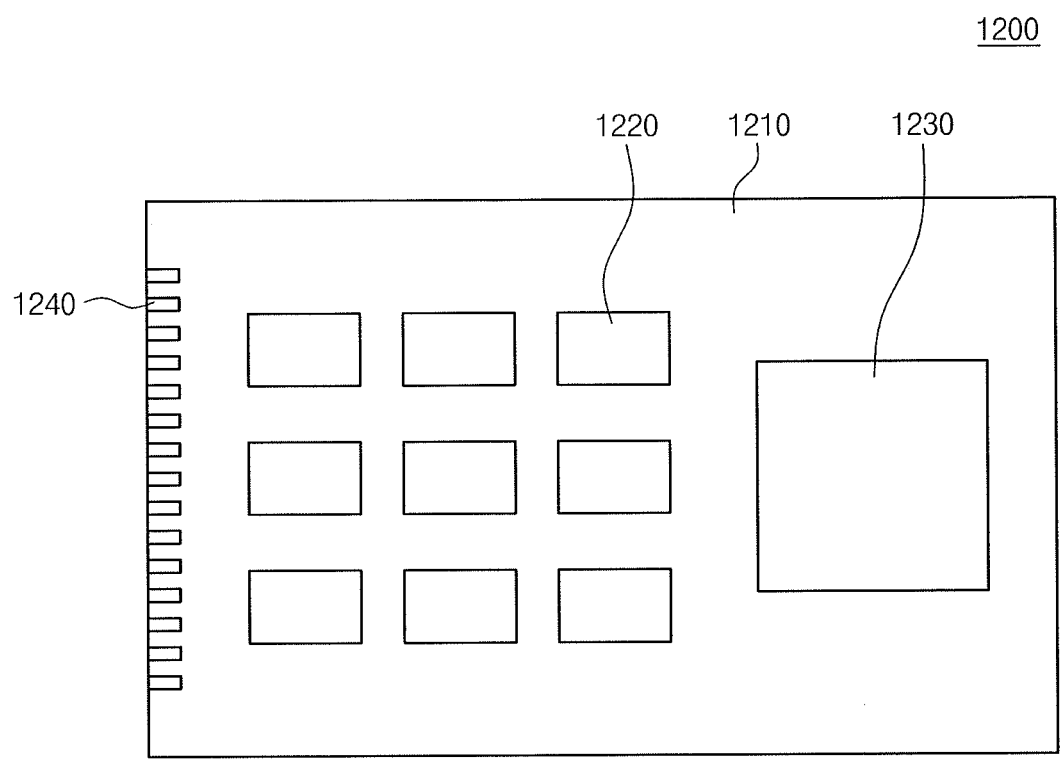
FIG. 25 illustrates a drawing showing an illustration of an exemplary package module including a semiconductor device to which embodiments may be applied.

FIG. 25 illustrates a drawing showing an exemplary package module including the semiconductor devices of, e.g., at least one of the first through eleventh exemplary embodiments.

Referring to FIG. 25, a package module 1200 may be provided in a type of a semiconductor integrated circuit chip 1220 and a semiconductor integrated circuit chip 1230 packaged by a quad flat package (QFP). The package module 1200 may be formed by setting the semiconductor integrated circuit chips 1220 and 1230 to which the semiconductor device technology in accordance with an exemplary embodiment is applied on a substrate 1210. The package module 1200 may be connected to an external electronic device through an external connection terminal 1240 provided on, e.g., one side of the substrate 1210.

Figure 26:
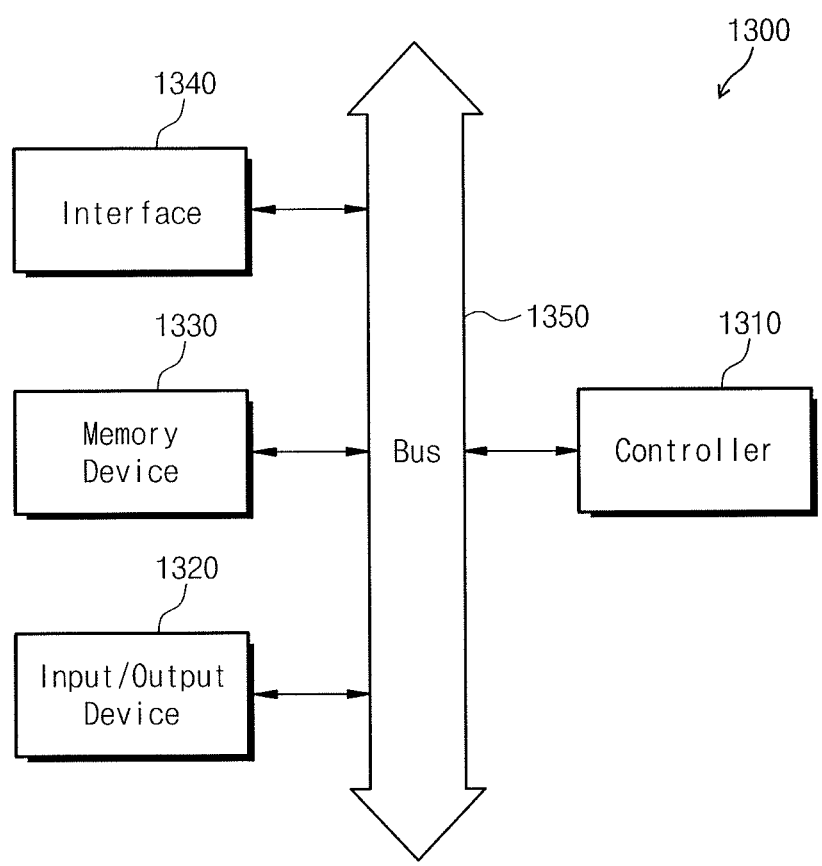
FIG. 26 illustrates a block diagram showing an illustration of an exemplary electronic device including a semiconductor device to which embodiments may be applied.

The aforementioned semiconductor device technology may be applied to an electronic system. FIG. 26 illustrates a block diagram showing an electronic device including a semiconductor device to which the technology of exemplary embodiments may be applied.

Referring to FIG. 26, an electronic system 1300 may include a controller 1310, an input/output device 1320, and a memory device 1330. The controller 1310, the input/output device 1320, and the memory device 1330 may be connected to each other through a bus 1350. The bus 1350 may be a path through which data transfer occurs. The controller 1310 may include at least one of, e.g., a micro processor, a digital signal processor, a microcontroller, and a logic device having a function similar to the micro processor, the digital signal processor and the microcontroller.

The controller 1310 and the memory device 1330 may include a semiconductor device in accordance with an exemplary embodiment. The input/output device 1320 may include at least one selected from a keypad, a keyboard and a display device. The memory device 1330 may be a device storing data. The memory device 1330 may store data and/or a command executed by the controller 1310. The memory device 1330 may include a volatile memory device and/or a nonvolatile memory device. The memory device 1330 may be formed of, e.g., a flash memory. For example, a flash memory to which a technique of exemplary embodiments may be applied may be built in a data processing system such as a mobile device or a desk top computer. The flash memory may be constituted by a semiconductor disc device (SSD). For example, the electronic system 1300 may stably store huge amounts of data in the flash memory system.

The electronic system 1300 may further include an interface 1340 for transmitting data to a communication network and/or receiving data from a communication network. The interface 1340 may be a wire/wireless type. The interface 1340 may include an antenna or a wire/wireless transceiver. Although not illustrated in the drawing, the electronic system 1300 may further include an application chip set, a camera image processor (CIS), and/or an input/output device.

The electronic system 1300 may be embodied by, e.g., a mobile system, a personnel computer, an industrial computer, or a logic system performing a variety of functions. For instance, the mobile system may be one of, e.g., a personal digital assistant (PDA), a portable computer, a web tablet, a mobile phone, a wireless phone, a laptop computer, a memory card, a digital music system and a data transmission/receipt system. In the case that the electronic system 1300 is an equipment that can perform a wireless communication, the electronic system 1300 may be used in a communication interface protocol of a third generation such as CDMA, GSM, NADC, E-TDMA, CDMA2000.

By way of summation and review, with a view toward improving performance and decreasing the size of electrical products/electronic products, various technologies for stacking components are being developed. The twin "stack" being used in a semiconductor device field may mean vertically stacking at least two chips and/or packages. According to the stack technology, in case of a memory device, products having memory capacity of more than two times the memory capacity that can be embodied in a non-stacked semiconductor integration process may be realized. The stack package may increase memory capacity and may also increase mounting density and efficiency of using a mounting area.

In the stack package, a flip chip bonding method may realize improved signal transmitting speed. Also, in a stacked structure of the flip chip bonding method, a through silicon via (TSV) has been suggested to transmit an electric signal between chips and/or packages. Process technologies such as grinding, a CMP (chemical mechanical process), a dry etching, etc., may be used to expose the TSV of a back side of the stack package. In the case that the TSV is formed of copper, copper ions generated from the TSV may contaminate nearby silicon and/or an oxide insulating films. For example, the copper contaminant may diffuse into the silicon as time goes on or when it receives a thermal stress while a subsequent process is performed. Further, an oxide insulating film may be unsuited for preventing copper from diffusing therein or therethrough. Copper diffused into silicon may, e.g., change an electrical characteristic of devices formed thereon. Furthermore, this may deteriorate reliability of the device and may cause a failed device.

Further, in a TSV exposure process using B/L or CMP, copper may be polished together with silicon and thereby the silicon could potentially be easily exposed to copper ions. In a structure in which copper is exposed through a CMP process after an oxide insulating film is first formed or in the TSV exposure process using photolithography or dry etch, copper contamination may be progressed. This may occur even if the silicon is not directly exposed because in such a structure it is difficult to prevent copper from diffusing into silicon by a subsequent thermal stress and/or at a room temperature.

In contrast, embodiments, e.g., the exemplary embodiments discussed above, relate to forming a barrier metal before the TSV is exposed to, e.g., reduce the possibility of and/or prevent copper ions from diffusing into the silicon from the TSV.

For example, in embodiments, an antipollution film may be disposed on an insulating film liner that is interposed between a substrate and a through via plug. The insulating film liner may have a recessed surface. The antipollution film may cover the substrate. Accordingly, the semiconductor device in accordance with an exemplary embodiment may include the antipollution film so that the substrate may be protected from being polluted by copper ions. Thus, the possibility of generation of leakage currents may be reduced and/or prevented and reliability may be improved.

In a manufacturing method of the semiconductor device in accordance with exemplary embodiments, a planarization process may be performed in a state of covering a part of sidewall of lower portion of a substrate. Thereafter, a through via plug may be exposed and the substrate may be protected from being polluted by copper ions generated from the through via plug.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a through via hole in a substrate;
    forming an insulating film liner covering a sidewall of the through via hole;
    forming a through via plug filling the through via hole;
    exposing a bottom surface and a part of a sidewall of the insulating film liner by removing a lower portion of the substrate such that a bottom surface of the substrate is formed;
    removing portions of the insulating film liner on a bottom surface and a sidewall of the through via plug so as to expose a part of the sidewall of the through via hole;
    forming an antipollution film to cover the bottom surface of the substrate, and the bottom surface and the sidewall of the through via plug, the antipollution film being on the exposed part of the sidewall of the through via hole;
    forming an auxiliary insulating film on the antipollution film; and
    removing a part of the antipollution film and exposing the bottom surface of the through via plug by performing a planarization process,
    wherein after the planarization process, an exposed surface of the auxiliary insulating film, an exposed protrusion of the antipollution film, and an exposed surface of the through via plug are horizontally aligned.

2. The method as claimed in claim 1, wherein a height of the exposed part of the sidewall of the through via hole is equal to or less than a thickness of the insulating film liner.

3. The method as claimed in claim 1, wherein, when exposing the bottom surface and the part of the sidewall of the insulating film liner, the bottom surface of the through via plug protrudes beyond the bottom surface of the substrate.

4. The method as claimed in claim 1, wherein removing the lower portion of the substrate is performed by an etch-back process selectively removing the substrate.

5. The method as claimed in claim 1, wherein removing portions of the insulating film liner is performed by an isotropic etching process selectively removing the insulating film liner.

6. The method as claimed in claim 1, further comprising forming a redistributed interconnection pattern on the auxiliary insulating film and contacting the through via plug.

7. The method as claimed in claim 1, further comprising forming a redistributed interconnection pattern on antipollution film and contacting the through via plug.

8. The method as claimed in claim 1, wherein removing portions of the insulating film liner results in a distance from the bottom surface of the insulating film liner being equal to or less than a thickness of the insulating film liner.

* * * * *